United States Patent
Antoku et al.

(10) Patent No.: US 11,289,442 B2
(45) Date of Patent: Mar. 29, 2022

(54) GOLD-COATED SILVER BONDING WIRE AND MANUFACTURING METHOD THEREOF, AND SEMICONDUCTOR DEVICE AND MANUFACTURING METHOD THEREOF

(71) Applicant: Tanaka Denshi Kogyo K.K., Saga (JP)

(72) Inventors: Yuki Antoku, Saga (JP); Shota Kawano, Saga (JP); Yusuke Sakita, Saga (JP)

(73) Assignee: Tanaka Denshi Kogyo K.K., Kanzaki-gun (JP)

( * ) Notice: Subject to any disclaimer, the term of this patent is extended or adjusted under 35 U.S.C. 154(b) by 71 days.

(21) Appl. No.: 16/869,694

(22) Filed: May 8, 2020

(65) Prior Publication Data

US 2020/0350273 A1  Nov. 5, 2020

Related U.S. Application Data

(63) Continuation of application No. PCT/JP2019/030377, filed on Aug. 1, 2019.

(30) Foreign Application Priority Data

Apr. 12, 2019  (JP) .............................. JP2019-076471

(51) Int. Cl.
*H01L 23/00* (2006.01)
*H01L 23/495* (2006.01)
(Continued)

(52) U.S. Cl.
CPC .......... *H01L 24/45* (2013.01); *H01L 23/3121* (2013.01); *H01L 23/4952* (2013.01);
(Continued)

(58) Field of Classification Search
CPC ...................................................... H01L 24/45
See application file for complete search history.

(56) References Cited

U.S. PATENT DOCUMENTS

2014/0327018 A1   11/2014  Tatsumi et al.
2017/0365576 A1   12/2017  Oyamada et al.
2018/0026004 A1*  1/2018  Han .................... H01L 25/0657
                                                              257/737

FOREIGN PATENT DOCUMENTS

CN        103474408 A       12/2013
JP        2001-196411 A     7/2001
(Continued)

OTHER PUBLICATIONS

Search Report and written opinion for Singapore application No. 11202004295W, dated Feb. 26, 2021.
(Continued)

*Primary Examiner* — Yu-Hsi D Sun
(74) *Attorney, Agent, or Firm* — Orrick, Herrington & Sutcliffe LLP; Joseph A. Calvaruso; K. Patrick Herman

(57) ABSTRACT

A gold-coated silver bonding wire includes: a core material containing silver as a main component; and a coating layer provided on a surface of the core material and containing gold as a main component. The gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the bonding wire.

6 Claims, 6 Drawing Sheets

(51) Int. Cl.
  *H01L 23/31* (2006.01)
  *H01L 25/065* (2006.01)
  *H01L 25/00* (2006.01)

(52) U.S. Cl.
  CPC .......... *H01L 24/48* (2013.01); *H01L 25/0652* (2013.01); *H01L 25/50* (2013.01); *H01L 2224/45139* (2013.01); *H01L 2224/45565* (2013.01); *H01L 2224/45644* (2013.01); *H01L 2224/48137* (2013.01); *H01L 2224/48247* (2013.01)

(56) References Cited

FOREIGN PATENT DOCUMENTS

| JP | 2001196411 A | * | 7/2001 | ............. H01L 24/43 |
|----|--------------|---|--------|--------------------------|
| JP | WO2013/129253 A1 | | 9/2013 | |
| JP | 2016-115875 A | | 6/2016 | |
| JP | 2019-052375 A | | 4/2019 | |

OTHER PUBLICATIONS

Office Action for Japanese application No. 2019-076471, dated Jul. 14, 2020.

International Search Report for PCT/JP2019/030377, dated Nov. 5, 2019.

\* cited by examiner

GOLD-COATED SILVER BONDING WIRE AND MANUFACTURING METHOD THEREOF, AND SEMICONDUCTOR DEVICE AND MANUFACTURING METHOD THEREOF

CROSS-REFERENCE TO RELATED APPLICATION

This application is a continuation of prior International Application No. PCT/JP2019/030377, filed on Aug. 1, 2019 which is based upon and claims the benefit of priority from Japanese Patent Application No. 2019-076471, filed on Apr. 12, 2019; the entire contents of all of which are incorporated herein by reference.

FIELD

The present invention relates to a gold-coated silver bonding wire and a manufacturing method thereof, and a semiconductor device using the wire and a manufacturing method thereof.

BACKGROUND

An electrode of a semiconductor chip and an external electrode of a circuit substrate such as a lead frame or a circuit board are connected by, for example, wire bonding. In the wire bonding, for example, in general, one end of a bonding wire is bonded to the electrode of the semiconductor chip by a method referred to as ball bonding (first bonding), and the other end of the bonding wire is bonded to the external electrode of the circuit substrate by a method referred to as wedge bonding (second bonding). In the ball bonding, one end of the bonding wire is melted by discharge or the like, and spherically solidified based on surface tension or the like to form a ball. The solidified ball is referred to as a free air ball (FAB), and connected to the electrode of the semiconductor chip by an ultrasonic wave-combined thermocompression bonding method or the like.

For the bonding wire, metal wires such as a gold wire, a silver wire, a copper wire, and an aluminum wire, coated wires in which the above metal wires are coated with other metal, and the like are used. A semiconductor device is formed by resin-sealing the semiconductor chip and the circuit substrate connected by the wire bonding, and for example, there is known a semiconductor memory device in which memory chips are built, or the like. In such a semiconductor device, for example, in order to achieve miniaturization, higher performance such that storage capacity is made higher, and higher functions, of the device, and the like, to make formation density of elements and wiring density higher is in progress, and a narrower pitch for a formation pitch of the electrodes of the semiconductor chip is designed accompanying the above. In a ball compression portion in which one end of the bonding wire has been subjected to ball bonding, the narrower pitch between the electrodes causes ion migration between adjacent ball compression portions, and is likely to cause a phenomenon in which a short circuit occurs between the electrodes (ion migration).

The ion migration becomes a factor in impairing reliability and soundness of an integrated circuit. As a form of the ion migration, in general, there is a state where the metal is precipitated in a dendritic form between the parallel electrodes on a board surface layer, which is referred to as a dendrite, or a state where metal ions eluted from an anode are precipitated at a boundary between a glass fiber and an epoxy resin mainly in a board inner layer, which is referred to as a CAF (Conductive Anodic Filament). The form of the ion migration of concern for the semiconductor device is the dendrite. In the semiconductor device, a gap sometimes occurs at a boundary between the semiconductor chip or the substrate and the epoxy resin, and water permeated from the epoxy resin and an electric field applied between the electrodes on the insulated chip act on each other to cause ionization of metal of the anode, resulting in that the metal ions move between the ball compression portions and are thereafter reduced at a cathode to be precipitated. This phenomenon occurs continuously while the electric field is applied, so that the metal precipitated in the dendritic form reaches the anode in due time, thereby causing an insulation deterioration or a short circuit.

The ease of occurrence of the ion migration is known to vary depending on the kind of conductor metal, the intensity of an electric field applied between the electrodes, or the like. Regarding the conductor metal, in general, the ion migration is considered to be likely to occur in order of silver (Ag)→copper (Cu)→lead (Pb)→tin (Sn)→zinc (Zn)→gold (Au). For example, the ion migration is less likely to occur between ball compression portions in each of which a gold bonding wire is used and, on the other hand, is likely to occur between ball compression portions in each of which a silver bonding wire is used. The silver bonding wire is more inexpensive than the gold bonding wire, while they are equal in durability and conductivity, and further, the silver bonding wire has higher deformability to be more likely to absorb stress than a copper bonding wire, thereby being excellent in resistance to fracture such as a crack due to thermal stress. However, on the other hand, the silver bonding wire is likely to cause the ion migration based on the narrower pitch between the electrodes, or the like as described above. Further, the electric field intensity is determined by a voltage applied between the electrodes and an inter-electrode distance, and as the electric field intensity becomes higher, the ion migration is more likely to occur. In recent years, in the semiconductor device, a reduction in power consumption is promoted, and the voltage applied thereto has a tendency to be lowered, on the other hand, the electric field intensity is presumed to become higher and higher as the narrower pitch progresses, so that suppression thereof is strongly demanded. In order to suppress the ion migration of silver, there is known a method of being alloyed with gold or palladium, but there occurs a problem that alloying pure silver with palladium or gold makes electrical resistance of the silver alloy wire high.

Thus, regarding the silver bonding wire, it is also proposed that a coating layer of gold or a gold alloy is formed on a surface of a silver core material. However, although the gold in the coating layer functions as a suppression material of ionization of silver due to electric field application and water, only forming the coating layer does not make it possible to effectively suppress the ion migration. That is, when a ball is formed by melting one end of a gold-coated silver bonding wire, the gold in the coating layer enters the molten silver core material, and by solidifying the ball in the above state, an exposure amount of silver to a surface of the FAB is increased. When such a FAB is bonded to the electrode, the silver present in a relatively large amount on a surface of the ball compression portion causes the ion migration, which prevents the insulation deterioration or the short circuit between the ball compression portions from being effectively suppressed.

Regarding a conventional coated silver bonding wire, for example, International Publication Pamphlet No. 2013/129253 discloses a bonding wire having a wire coating layer having one or more kinds of Pd, Au, Zn, Pt, Ni, and Sn or an alloy of these, or an oxide or a nitride of these metals on a surface of an Ag or Ag alloy wire. Patent Document 1 discloses that when the Ag or Ag alloy wire having the coating layer is used for connection in a power semiconductor device, migration in which Ag ions are eluted, or the like is prevented. However, because Patent Document 1 is built on the premise that a metal wire is subjected to wedge bonding, it is not considered that constituent elements of the coating layer enter the Ag wire at a time of FAB formation, and furthermore it does not disclose a constitution for suppressing the entering of the constituent elements into the Ag wire.

Further, Japanese Laid-open Patent Publication No. 2001-196411 discloses a bonding wire having an Ag wire and an Au film coating the Ag wire, in which the Au film contains at least one element of Na, Se, Ca, Si, Ni, Be, K, C, Al, Ti, Rb, Cs, Mg, Sr, Ba, La, Y, and Ce. Patent Document 2 discloses that because a shape of a FAB does not become axisymmetric in the Au-coated Ag wire, a concentration of arc discharge on a single point is suppressed by containing the above-described elements in the Au film, and the shape of the FAB is stabilized by generating an arc from the entire surface. However, in Patent Document 2, it is not considered that Au enters the Ag wire at a time of FAB formation, and furthermore, it does not disclose a constitution for suppressing the entering of Au into the Ag wire. Accordingly, Patent Document 2 does not indicate that when the gold-coated silver bonding wire is used, ion migration occurs, and furthermore does not disclose a constitution of the gold-coated silver bonding wire for suppressing the ion migration.

SUMMARY

A problems to be solved by the present invention is to provide a gold-coated silver bonding wire which makes it possible to suppress a short circuit or the like based on ion migration between ball compression portions, and a manufacturing method thereof. Further, the problem is to provide a semiconductor device which makes it possible to enhance insulation reliability or the like between the ball compression portions also in a case of a narrower pitch between electrodes by using such a gold-coated silver bonding wire and a manufacturing method thereof.

A first gold-coated silver bonding wire in the present invention includes: a core material containing silver as a main component; and a coating layer provided on a surface of the core material and containing gold as a main component. The first gold-coated silver bonding wire of the present invention contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the wire.

A second gold-coated silver bonding wire in the present invention includes: a core material containing silver as a main component; and a coating layer provided on a surface of the core material and containing gold as a main component. The second gold-coated silver bonding wire of the present invention contains gold in a range of not less than 2 mass % nor more than 7 mass % with respect to a total content of the wire, and contains at least one sulfur group element selected from the group consisting of sulfur, selenium, and tellurium, and when a free air ball is formed at one end of the gold-coated silver bonding wire, the free air ball has, in a cross-sectional view of the bonding wire and the free air ball, on a vertical line stretching from a midpoint of a line connecting neck portions between the wire and the ball to a position corresponding to a lowest point of the ball, a gold concentration region in a section corresponding to a position of 60% or more from the midpoint of the line connecting the neck portions.

A manufacturing method of the gold-coated silver bonding wire of the present invention including a core material containing silver as a main component, and a coating layer provided on a surface of the core material and containing gold as a main component, wherein the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the wire.

A semiconductor device of the present invention includes: one semiconductor chip having at least one electrode or a plurality of semiconductor chips each having at least one electrode; and a lead frame or a board having at least one electrode, wherein a gold-coated silver bonding wire is connected at least one selected from between the electrode of the semiconductor chip and the lead frame, between the electrode of the semiconductor chip and the electrode of the board, and between the electrodes of the plurality of semiconductor chips, wherein the gold-coated silver bonding wire includes: a core material containing silver as a main component; and a coating layer provided on a surface of the core material and containing gold as a main component, and wherein the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the wire.

A manufacturing method of the semiconductor device of the present invention including one semiconductor chip having at least one electrode or a plurality of semiconductor chips each having at least one electrode; and a lead frame or a board having at least one electrode, wherein a gold-coated silver bonding wire is connected at least one selected from between the electrode of the semiconductor chip and the lead frame, between the electrode of the semiconductor chip and the electrode of the board, and between the electrodes of the plurality of semiconductor chips, wherein the gold-coated silver bonding wire includes: a core material containing silver as a main component; and a coating layer provided on a surface of the core material and containing gold as a main component, and wherein the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the wire.

Effect of the Invention

According to a gold-coated silver bonding wire and a manufacturing method thereof of the present invention, when a free air ball (FAB) is formed at one end of the bonding wire, a sulfur group element (at least one of sulfur, selenium, and tellurium) which a coating layer contains promotes formation of a gold concentration region on a surface of the FAB. The gold concentration region on the FAB surface suppresses ion migration. Accordingly, it is possible to suppress a short circuit or the like between electrodes when one end of the gold-coated silver bonding wire of the present invention is ball-bonded to the electrode, and furthermore ball bonding in the atmosphere can be promising.

According to a semiconductor device and a manufacturing method thereof of the present invention, a gold concentration region formed on a FAB surface suppresses occurrence of ion migration. Accordingly, also in a case of making a pitch between electrodes narrower, an insulation deterioration, a short circuit, or the like can be suppressed, which makes it possible to enhance manufacturability, reliability, and the like of the semiconductor device.

DETAILED DESCRIPTION

Hereinafter, a gold-coated silver bonding wire and a manufacturing method thereof, and a semiconductor device and a manufacturing method thereof of an embodiment of the present invention will be explained with reference to the drawings. In each embodiment, substantially the same components are denoted by the same reference signs, and an explanation thereof is sometimes partially omitted. The drawings are schematic, and a relationship between a thickness and a planar size, thickness proportions of the respective portions, a ratio between a vertical size and a transverse size, and the like are sometimes different from actual ones.

(Gold-Coated Silver Bonding Wire and Manufacturing Method Thereof)

Figure 1:
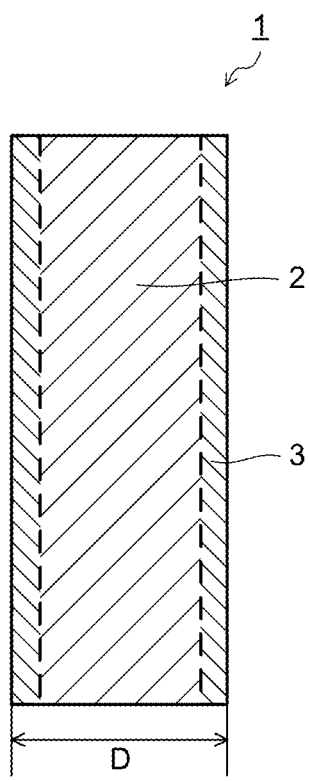
FIG. 1 is a vertical cross-sectional view illustrating a gold-coated silver bonding wire of an embodiment.
Figure 2:
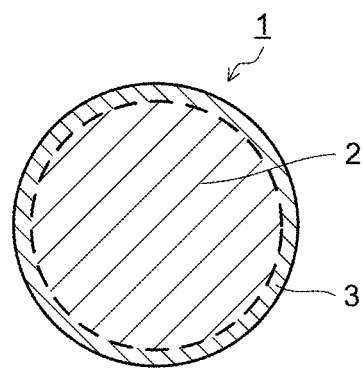
FIG. 2 is a transverse cross-sectional view illustrating the gold-coated silver bonding wire of the embodiment.

As illustrated in FIG. 1 and FIG. 2, a gold-coated silver bonding wire 1 of an embodiment has a core material (also referred to as a silver core material) 2 having silver (Ag) as a main component, and a coating layer 3 provided on a surface of the core material 2, containing gold (Au) as a main component, and containing at least one sulfur group element selected from sulfur (S), selenium (Se), and tellurium (Te). In the gold-coated silver bonding wire 1 of the embodiment, the gold is contained in a range of not less than 2 mass % nor more than 7 mass %, with respect to a total content of the core material 2 and the coating layer 3 (a total content of the wire 1), and the sulfur group element is contained in a range of not less than 1 mass ppm nor more than 80 mass ppm with respect to a total content of the core material 2 and the coating layer 3 (a total content of the wire 1).

The core material (silver core material) 2 having silver as the main component mainly constitutes the bonding wire 1 of the embodiment, and mainly serves a function of the bonding wire 1. Such a core material 2 may be composed of pure silver, or may be composed of a silver alloy in which an additive element is added to silver. However, so as not to impair a function as a silver bonding wire, the core material 2 contains silver as the main component. Here, containing silver as the main component means that the core material 2 contains silver of 50 mass % or more. When the core material 2 is composed of the silver alloy, it is preferable to apply the silver alloy containing at least one element selected from phosphorus (P), gold (Au), palladium (Pd), platinum (Pt), nickel (Ni), copper (Cu), iron (Fe), calcium (Ca), rhodium (Rh), germanium (Ge), gallium (Ga), and indium (In), which is not restrictive.

The additive element in the silver alloy composing the core material 2 exhibits the effect on improvement in bondability to the electrode and mechanical strength, or the like. However, because a too large content of the additive element increases resistance of the core material 2, and causes the function as the silver bonding wire to be likely to be lowered, the content of the additive element is preferably set so that a specific resistance of the gold-coated silver bonding wire 1 falls within a range of 2.3 µΩ·cm or less. Concretely, the silver content in the silver alloy is preferably 98 mass % or more. When either the pure silver or the silver alloy composes the core material 2, inevitable impurities may be contained, but the impurity content in which the specific resistance of the gold-coated silver bonding wire 1 falls within a range of 2.3µΩ·cm or less is preferable.

The gold-coated silver bonding wire 1 of the embodiment has the coating layer 3 provided on the surface of the above-described core material 2 having silver as the main component. The coating layer 3 contains gold as the main component. Here, containing gold as the main component means that the coating layer 3 contains silver of 50 mass % or more. The coating layer 3 further contains at least one sulfur group element selected from sulfur, selenium, and tellurium. Note that the coating layer 3 may contain an element other than gold and the sulfur group element.

As described in detail later, when the FAB is formed at the gold-coated silver bonding wire 1, the sulfur group element in the coating layer 3 promotes formation of a gold concentration region to a surface region of the FAB. The gold concentration region means, when the FAB is formed, a region where the concentration of gold higher than in the inside of the ball is formed on a surface of the ball. Forming the gold concentration region in the surface region of the FAB makes it possible to suppress ion migration between ball compression portions when ball bonding is performed by using the FAB formed at the gold-coated silver bonding wire 1. That is, the coating layer 3 having gold as the main component contains the sulfur group element to thereby suppress entering of gold into the inside of a molten ball, which makes it possible to form the gold concentration region in the surface region of the FAB. Accordingly, because the silver concentration on the FAB surface can be kept low, it is possible to suppress occurrence of the ion migration between the ball compression portions.

A complete understanding is not provided for a mechanism insisted in the present invention, in which the gold concentration region on the FAB surface is formed, but in the process of forming the FAB, the sulfur group element in the coating layer 3 is presumed to act on surface tension of the coating layer 3 in a molten state and contribute to the formation of the gold concentration region. In a case of a conventional gold-coated silver bonding wire, surface tension of molten silver is smaller than surface tension of molten gold, a flow caused by a difference in surface tension (Marangoni convection) occurs from small surface tension to large surface tension, namely, from the molten silver (molten ball) toward the molten gold (coated gold in the molten state), so that the molten gold moves inside the ball. On the other hand, when the sulfur group element is present in the coating layer 3, the surface tension of the molten coating layer 3 becomes smaller than that of the molten silver, and a direction of the Marangoni convection is reversed from the molten gold in a direction of the molten silver, so that the molten gold does not enter the inside of the FAB.

The timing at which the above-described effect of the sulfur group element in the coating layer 3 is exhibited and the process of forming the gold concentration region are explained along the formation process of the FAB. The FAB is formed by subjecting the gold-coated silver bonding wire 1 to second bonding onto a lead or a bump, thereafter winding off the wire with a predetermined length, generating arc discharge between a tip of the cut bonding wire 1 and a discharge torch, and melting the wire tip. The bonding wire 1 is deformed by being crashed with a capillary at a time of the second bonding, so that the coating layer 3 is not present in a region where the bonding wire 1 and the capillary are brought into contact with each other, resulting in a state of exposing the core material 2. In an initial stage of the molten ball formation, a section where the coating layer 3 is not present is present in the ball obtained by melting only the wire tip exposing this core material 2, so that the gold concentration region is not formed. When the not-deformed wire portion is melted, the sulfur group element in the coating layer 3 acts on the surface tension at a time of melting, and the molten gold is present in the surface region of the FAB without entering the inside of the FAB. Then, the FAB grows from a small ball to a large ball, and gold is supplied continuously from the bonding wire 1. The molten gold is alloyed with the molten core material 2 by heat of the arc discharge.

In the gold-coated silver bonding wire 1 having the coating layer 3, with respect to the total content of the wire 1, the gold is contained in a range of not less than 2 mass % nor more than 7 mass %. When the content of the gold with respect to the total content of the wire 1 is less than 2 mass %, it is not possible to suppress the ion migration between the ball compression portions each using the FAB formed at the gold-coated silver bonding wire 1 having the silver core material 2 as a main body. When the content of the gold with respect to the total content of the wire 1 is over 7 mass %, a ball shape at a time of melting, and furthermore, form-ability of a FAB shape, and the like are reduced, and a manufacturing cost of the gold-coated silver bonding wire 1 is increased. The content of the gold with respect to the total content of the wire 1 is more preferably 3.5 mass % or more, and more preferably 5.5 mass % or less, depending on a diameter of the wire 1 or a thickness of the coating layer 3.

The sulfur group element mainly present in the coating layer 3 is preferably contained in a range of not less than 1 mass ppm nor more than 80 mass ppm with respect to the total content of the above-described gold-coated silver bonding wire 1. When the content of the sulfur group element with respect to the total content of the wire 1 is less than 1 mass ppm, it is not possible to sufficiently obtain a concentration effect of gold at a time of the FAB formation, and formability of the gold concentration region thereby. When the content of the sulfur group element with respect to the total content of the wire 1 is over 80 mass ppm, a crack, a fracture, or the like is likely to occur in the coating layer 3, a formation effect of the coating layer 3 is reduced, and workability of wire drawing or the like is reduced, which make it difficult to obtain the gold-coated silver bonding wire 1 with a desired wire diameter. Note that two or more kinds of the sulfur group elements may be mixed and applied, and in that case, the total content of the sulfur group elements is adjusted so as to fall within the above-described content range.

A calculation method of the content of the gold and the content of the sulfur group element in the total content of the gold-coated silver bonding wire 1 is described. First, in order to calculate the gold content, the bonding wire 1 is put in a dilute nitric acid to dissolve the core material 2, thereafter collecting a solution. A hydrochloric acid is added to this solution, to prepare a constant-volume solution with ultrapure water. The coating layer 3 is dissolved with dilute aqua regia, to prepare a constant-volume solution with ultrapure water. A quantitative analysis of gold in these constant-volume solutions is performed by an ICP atomic emission spectroscopy (ICP-AES: Inductively Coupled Plasma Atomic Emission Spectroscopy), thereby measuring the gold content.

Next, the content of the sulfur group element is calculated. In the content of selenium and tellurium in the coating layer 3, the bonding wire 1 is put in a dilute nitric acid to dissolve the core material 2, thereafter extracting the coating layer 3. Moreover, the coating layer 3 is heated and decomposed with dilute aqua regia, and thereafter measurement is performed by using a solution prepared in constant volume with ultrapure water. A quantitative analysis of selenium and tellurium in this constant-volume solution is measured by using an ICP mass spectrometry (ICP-MS: Inductively Coupled Plasma Mass Spectrometry). On the other hand, in the content of selenium and tellurium in the core material 2, the bonding wire 1 is put in a dilute nitric acid, and measurement is performed by the ICP-MS by using a solution in which the core material 2 has been dissolved. Thereafter, the gold content and the content of selenium and tellurium in the entire bonding wire 1 are calculated from the content of gold and the content of selenium and tellurium in the coating layer 3 and the core material 2. Further, other than the above, there is also a method of analyzing by attaching a hydride generation apparatus to the ICP-AES and generating hydrides of selenium and tellurium.

Further, the content of sulfur (S) in the core material 2 and the coating layer 3 is measured by using a combustion infrared absorption method with respect to the bonding wire 1. A weight of the bonding wire 1 per one-time measurement is preferably set to 0.5 g or more. When a sample is slightly soluble, a combustion aid may be used as necessary.

The above-described gold-coated silver bonding wire 1 preferably has a wire diameter (a diameter D illustrated in FIG. 1) of not less than 13 µm nor more than 50 µm. When the wire diameter of the wire 1 is less than 13 µm, a reduction in strength, conductivity, or the like causes a possibility of reducing reliability of wire bonding, or the like when the wire bonding is performed by using the bonding wire 1 in manufacturing a semiconductor device. When the wire diameter of the wire 1 is over 50 µm, bondability to the electrode is likely to be reduced. For example, an opening area of each of the electrodes of the semiconductor device, whose pitch has been made narrower, becomes smaller, resulting in that the opening area of the electrode becomes 80 µm or less. Thus, when the FAB is formed so as to house the FAB of the gold-coated silver bonding wire 1 within the opening area of the electrode, the risk of forming an asymmetric ball (eccentric ball) is increased, so that the bondability to the electrode is likely to be reduced.

In the gold-coated silver bonding wire 1 having the above-described wire diameter, a thickness of the coating layer 3 is preferably not less than 20 nm nor more than 500 nm according to the wire diameter. The thickness of the coating layer 3 indicates a thickness in a depth direction toward the core material 2 in a vertical direction from a surface of the wire 1 in a region having gold as a main component. When the thickness of the coating layer 3 is less than 20 nm, there is a possibility that the ion migration between the ball compression portions each using the FAB formed at the gold-coated silver bonding wire 1 cannot be suppressed sufficiently by the coating layer 3 having gold as the main component. When the thickness of the coating layer 3 is over 500 nm, formability of the coating layer 3 is likely to be reduced. Note that the thickness of the coating layer 3 is preferably set according to the wire diameter of the gold-coated silver bonding wire 1.

The larger the gold content in the coating layer 3 is, the more the effect of suppressing the ion migration is increased, so that it is sufficient that gold of at least 50 mass % or more is contained in the coating layer 3, and furthermore the gold content is preferably 80 mass % or more, and more preferably 99 mass % or more. The gold content of the coating layer 3 can be measured by a quantitative analysis of a wire uppermost surface by an Auger electron spectroscopy (AES) from the surface of the bonding wire 1. Note that the gold content mentioned here is a value with respect to the total content of the detected metallic elements, and does not include carbon, oxygen, and the like present on the surface due to absorption or the like.

Figure 3:
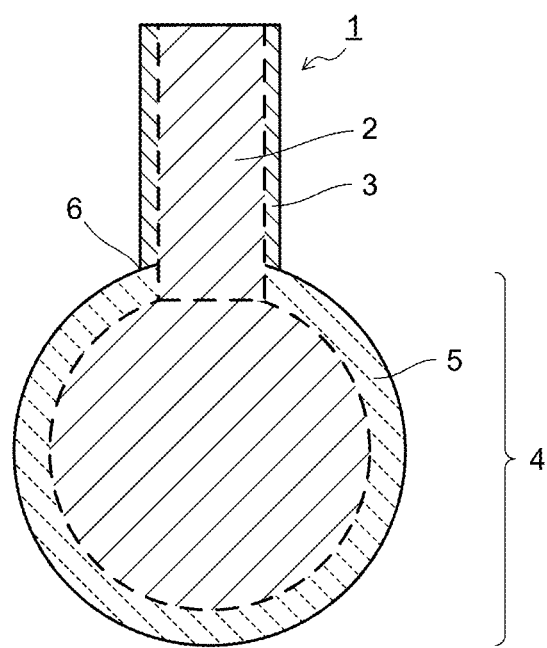
FIG. 3 is a cross-sectional view illustrating a state of forming a FAB at one end of the gold-coated silver bonding wire of the embodiment.

The thickness of the coating layer 3 is measured in the following manner. That is, in the gold-coated silver bonding wire 1, an element concentration analysis is performed from a surface in a depth direction thereof by the AES, a section located at 50% when a maximum value of the content of gold present in the vicinity of the surface is set to 100% is set as a boundary portion, and a region from the boundary portion to the surface is founded as the thickness of the coating layer 3. From the surface in the depth direction of the gold-coated silver bonding wire 1, the measurement can be performed by an AES analysis. For example, as a means of analyzing each element concentration of the coating layer 3 from the wire surface toward the silver core material 2, concentration measurement by the AES analysis is effective. Here as one example, by using an Auger electron spectroscopy apparatus (brand name: JAMP-9500F) manufactured by JEOL Ltd., after setting an acceleration voltage of a primary electron beam to 10 kV, a probe current thereof to 50 nA, and a beam diameter thereof to about 4 µmϕ, the concentration measurement has been performed under the condition of an Ar ion spatter rate of about 3.0 nm/min as a value converted into $SiO_2$ Next, when the wire bonding is performed by using the gold-coated silver bonding wire 1 of the embodiment, a FAB 4 is formed at one end of the gold-coated silver bonding wire 1 as illustrated in FIG. 3. As formation conditions of the FAB 4, for example, when the wire diameter of the gold-coated silver bonding wire 1 is not less than 13 µm nor more than 50 µm, an arc-discharge condition is set so that a discharge current value is not less than 30 mA nor more than 120 mA and a FAB 4 diameter is not less than 1.5 times nor more than 2.0 times as larger as the wire diameter. As a bonder apparatus, for example, a commercial product such as a bonder apparatus manufactured by Kulicke & Soffa Industries, Inc. (Automatic Bonder: IConn PLUS) can be used. When the bonder apparatus is used, a discharge time of not less than 50 µs nor more than 1000 µs, EFO-Gap of not less than 20 mil nor more than 40 mil (about not less than 635 µm nor more than 1143 µm), and a tail length of not less than 6 mil nor more than 12 mil (about not less than 152 µm nor more than 305 µm) are preferably applied as setting of the apparatus. Further, when a bonder apparatus other than the bonder apparatus is used, it is required to be used under the condition equal to that of the bonder apparatus, for example, the condition in which the diameter of the FAB 4 has a size equal to the diameter formed by the bonder apparatus.

At this time, when the gold-coated silver bonding wire 1 of the embodiment is used, a gold concentration region 5 is formed in the surface region of the FAB 4, for example, a range of 10 µm or less from the surface in the depth direction (or 10% or less with respect to the diameter of the FAB 4), depending on the diameter of the formed FAB 4, by the sulfur group element contained in the coating layer 3. This gold concentration region 5 is maintained also after bonding of the FAB 4 and the electrode, so that it exhibits the effect on the suppression of the ion migration. A concentration gradient is present from the surface toward the inside of the FAB 4 within the above-described range in the gold concentration region 5. However, the concentration gradient in the gold concentration region 5 is not important, and a gold concentration on the surface of the FAB 4 is more important for suppressing the ion migration.

That is, in a case of forming a gold layer not containing the sulfur group element on a surface of the silver core material, as in a conventional gold-coated silver bonding wire, when one end of a wire having the gold layer is melted to form a ball, gold in the gold layer enters the inside of the molten ball mainly composed of the silver core material, thereby forming a gold concentration region partially on a neck side of the molten ball, but the gold concentration region is not formed on most of a ball surface. A composition of the FAB surface formed by solidifying the molten ball is maintained as it is. Accordingly, as illustrated in FIG. 4, even though the gold layer is formed on the surface of the silver core material, the gold concentration region cannot be formed in a position effective in the suppression of the ion migration.

Figure 5:
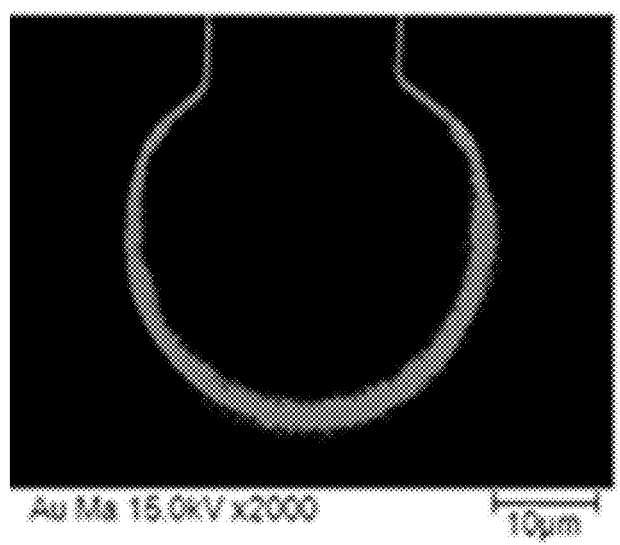
FIG. 5 is an EPMA image illustrating a gold concentration region on a FAB surface formed at one end of the gold-coated silver bonding wire of the embodiment.

In contrast, when the coating layer 3 contains a predetermined content of the sulfur group element, the entering of gold into the inside of the molten ball is suppressed, and the gold not absorbed inside the molten ball is present in the vicinity of the surface to form the gold concentration region. By solidifying this molten ball having the gold concentration region in the vicinity of the surface to form the FAB 4, the gold concentration region 5 is formed in the surface region of the FAB 4 as illustrated in FIG. 5. The gold concentration region 5 exhibits the effect of suppressing the occurrence of the ion migration between the ball compression portions as described above. Note that the gold concentration region 5 of the FAB 4 is preferably formed on the surface of 60% or more from a neck portion 6 between the gold-coated silver bonding wire 1 and the FAB 4 for the purpose of suppressing the occurrence of the ion migration. The gold concentration region 5 need not be formed on the entire surface of the FAB 4, and as long as the gold concentration region 5 is formed on the surface of 60% or more from the neck portion 6, a suppression effect on the ion migration can be obtained. Note that the surface of 60% or more from the neck portion 6 of the FAB 4, which is defined here, means, in the cross-sectional view of the bonding wire 1 and the FAB (ball) 4, on a vertical line stretching from the midpoint of a line connecting the neck portions 6 between the wire 1 and the ball 4 to a position corresponding to the lowest point of the ball 4, the section (the surface of the ball 4) corresponding to a position of 60% or more from the midpoint of the line connecting the neck portions 6. Concrete specifying method and measuring method of a formation range of the gold concentration region 5 are described in detail later.

Figure 4:
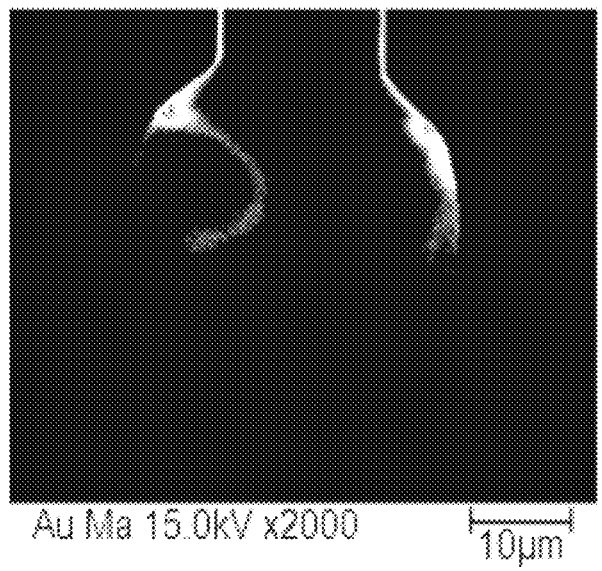
FIG. 4 is an EPMA image illustrating a gold concentration region on a FAB surface formed at one end of a conventional gold-coated silver bonding wire.

As illustrated in FIG. 4 and FIG. 5, the formation of the gold concentration region 5 can be observed by a plane analysis (for example, an acceleration voltage of 15 kV, a probe current of 290 nA) of an electron probe micro analyzer (EPMA) from a ball cross section.

For the purpose of satisfactorily obtaining the above-described suppression effect on the ion migration, a gold concentration with respect to a total content of silver and gold in the gold concentration region 5 is preferably 8 mass % or more, and furthermore, more preferably 10 mass % or more. In other words, setting a gold concentration with respect to a total content of silver and gold on the surface of the FAB 4 to 8 mass % or more makes it possible to suppress the ion migration between the ball compression portions each formed by using the FAB 4. When the gold concentration on the surface of the FAB 4 is less than 8 mass % and the gold concentration on the surface of the FAB 4 is low, a silver concentration on the surface is increased relatively, so that the above-described ion migration cannot be effectively suppressed. That is, such a surface of the FAB 4 does not exhibit the effect of the gold concentration region 5.

Figure 6:
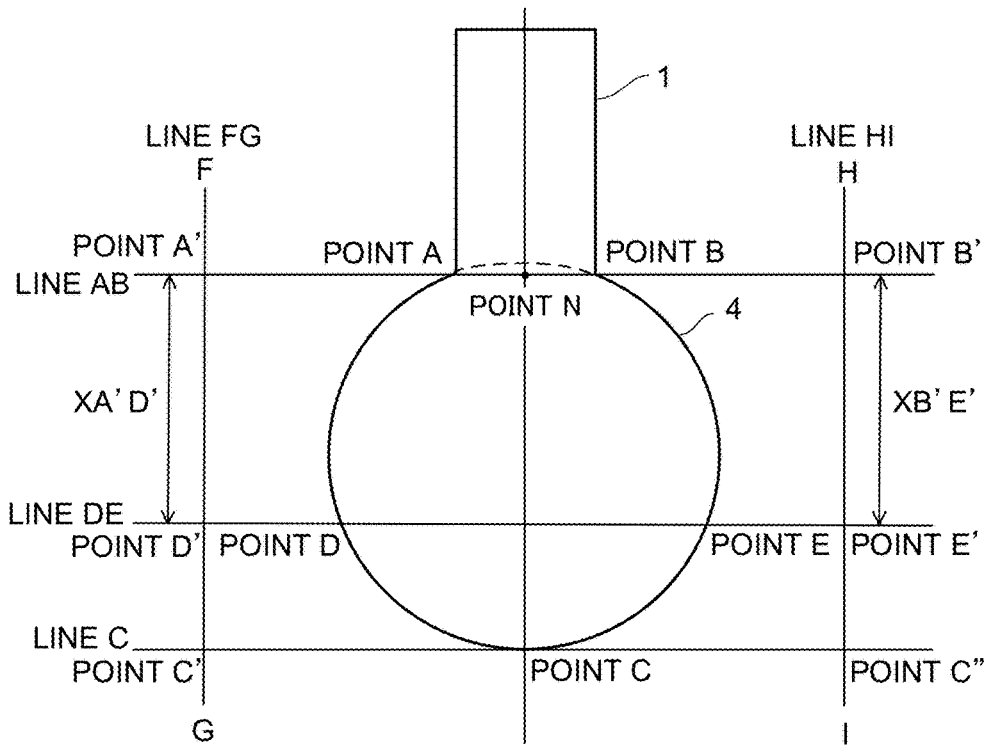
FIG. 6 is a cross-sectional view illustrating one example of analysis positions in the gold concentration region on the FAB surface formed at one end of the gold-coated silver bonding wire of the embodiment.
Figure 7:
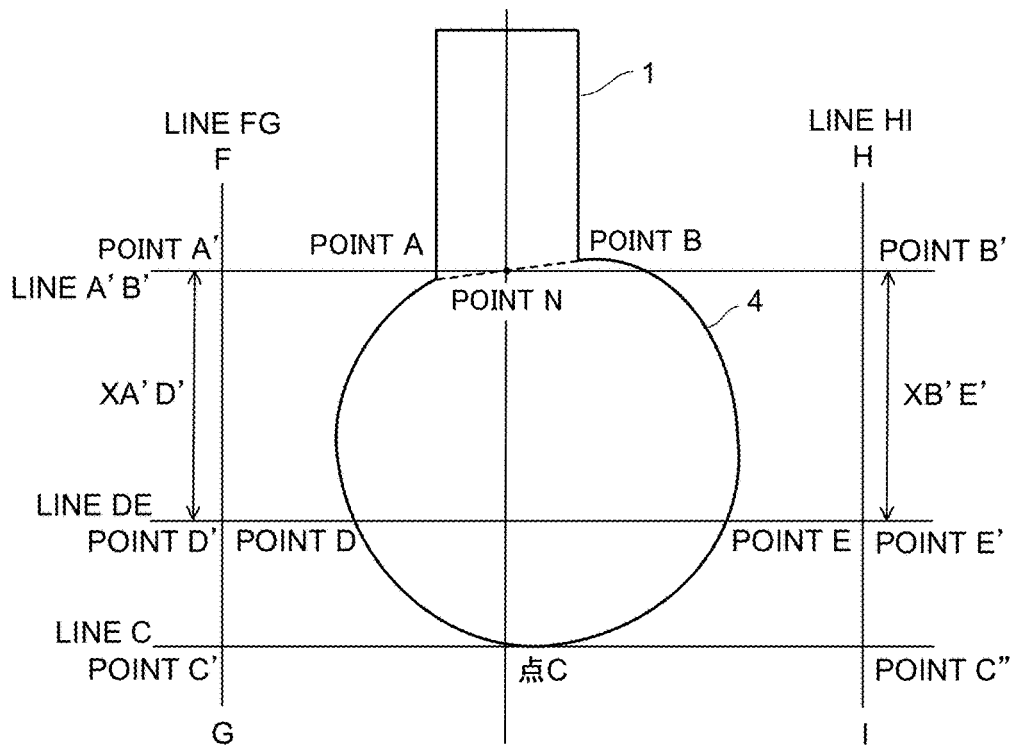
FIG. 7 is a cross-sectional view illustrating another example of analysis positions in a gold concentration region on a FAB surface formed at one end of the gold-coated silver bonding wire of the embodiment.

As described above, in the cross-sectional view of the bonding wire 1 and the FAB (ball) 4, on the vertical line stretching from the midpoint of the line connecting the neck portions 6 between the wire 1 and the ball 4 to the position corresponding to the lowest point of the ball 4, the gold concentration region 5 is formed on the surface of the ball 4 corresponding to a position of 60% or more from the midpoint of the line connecting the neck portions 6. The formation range of the gold concentration region 5 formed on the surface of the FAB 4 is described with reference to cross-sectional views in FIG. 6 and FIG. 7. Note that FIG. 6 and FIG. 7 are cross-sectional views, in each of which hatching is not illustrated in order to clearly illustrate the formation range and analysis positions of the gold concentration region 5. FIG. 6 illustrates a case where the below-mentioned point A and point B are horizontal. First, in the cross-sectional view of the wire 1 and the ball (FAB) 4, a line (a line AB) passing through the point A and the point B and being perpendicular to the longitudinal direction (axial direction) of the wire, which indicates the neck portions (boundary portion) between the wire 1 and the ball 4, is drawn to set the midpoint between these point A and point B as a point N. Next, a line (a line C) passing through a tip portion of the ball 4 (a point C/the lowest point) and being perpendicular to the longitudinal direction of the wire 1 is drawn. Lines (a line FG, a line HI) each perpendicular to the line AB and the line C are arbitrarily drawn at the right and left of the ball 4. Next, an intersection point of the line AB and the line FG is set as a point A', an intersection point of the line C and the line FG is set as a point C', an intersection point of the line HI and the line AB is set as a point B', and an intersection point of the line HI and the line C is set as a point C". Next, any point on a line A'C' passing through the point A' and the point C' is set as a point D'. Similarly, any point on a line B'C" is set as a point E'. Further, points which the point D' and the point E' project on the circumference of the ball 4 are set as a point D and a point E. Moreover, on the line A'C', a point which is 50% distant from the point A' is set as a point $D_1'$, a point which is 60% distant from the point A' is set as a point $D_2'$, and a point which is 70% distant from the point A' is set as a point $D_3'$, and points which the respective points project on the circumference of the ball 4 are set as a point $D_1$, a point $D_2$, and a point $D_3$. Similarly, on the line B'C", a point which is 50% distant from the point B' is set as a point $E_1'$, a point which is 60% distant from the point B' is set as a point $E_2'$, and a point which is 70% distant from the point B' is set as a point $E_3'$, and points which the respective points project on the circumference of the ball 4 are set as a point $E_1$, a point $E_2$, and a point $E_3$.

Here, FIG. 6 illustrates a case where the point A and the point B of the neck portions 6 are horizontal, but FIG. 7 illustrates a case where a point A and a point B are not horizontal. In such a case, a line (a line AB) passing through the point A and the point B, which indicates a boundary portion between a wire 1 and a ball 4, is drawn to set the midpoint of this line AB as a point N. Next, a line (a line C) passing through a tip portion of the ball 4 (a point C/the lowest point) and being perpendicular to the longitudinal direction of the wire 1 is drawn. A line A'B' passing through the point N being the midpoint of the line AB, and being parallel to the line C is stretched and drawn to the right/left outer sides of the ball 4. On the basis of the line C and the line A'B', in a similar manner to that in FIG. 6, a line FG and a line HI are drawn, and an intersection point (a point A') of the line A'B' and the line FG, an intersection point (a point C') of the line C and the line FG, an intersection point (a point B') of the line HI and the line A'B', and an intersection point (a point C") of the line HI and the line C are set respectively. Then, any point on a line A'C' passing through the point A' and the point C' is set as a point D', and any point on a line B'C" is set as a point E'. Points which the point D' and the point E' project on the circumference of the ball 4 are set as a point D and a point E. Moreover, on the line A'C', a point which is 50% distant from the point A' is set as a point $D_1'$, a point which is 60% distant from the point A' is set as a point $D_2'$, and a point which is 70% distant from the point A' is set as a point $D_3'$, and points which the respective points project on the circumference of the ball 4 are set as a point $D_1$, a point $D_2$, and a point $D_3$. Similarly, on the line B'C", a point which is 50% distant from the point B' is set as a point $E_1'$, a point which is 60% distant from the point B' is set as a point $E_2'$, and a point which is 70% distant from the point B' is set as a point $E_3'$, and points which the respective points project on the circumference of the ball 4 are set as a point $E_1$, a point $E_2$, and a point $E_3$.

As a method of confirming the formation range of the gold concentration region 5 formed on the surface of the FAB 4, there is a method of line-analyzing the above-described point D and point E of the FAB 4 illustrated in each of FIG. 6 and FIG. 7. As long as the respective points are measured by the line analysis to obtain the gold concentration of 8 mass % or more, it can be said that the gold concentration region 5 is formed up to the points. Because the gold concentration region 5 is formed gradually from the wire 1 side toward a tip side of the ball 4, the presence of the gold concentration region at these point D and point E indicates that the gold concentration region 5 is formed also on the circumference nearer to the wire 1 side than these points (a curve AD and a curve BE each illustrated in FIG. 6 and FIG. 7). As long as the point D and the point E are the points (the point $D_2$ and the point $E_2$) corresponding to the point $D_2'$ and the point $E_2'$ which are 60% distant from the point A' and the point B', the ion migration can be effectively prevented. That is, because the point $D_2$ and the point $E_2$ are each a portion located near the end of a bonding interface between the ball compression portion and the tip electrode when ball bonding is performed, they correspond to sections closest to ball-bonded adjacent ball compression portions. Therefore, the formation of the gold concentration region 5 at these point $D_2$ and point $E_2$ is the most effective in preventing the ion migration. In rare cases, when the ball compression portion is formed, due to contact with the capillary, damage at a time of plastic deformation, friction with ultrasonic wave applied in being bonded to the electrode on the chip, or the like, in the curve AD and the curve BE, there is a possibility of locally exposing a region where gold is not concentrated. However, it is important for the suppression effect on the ion migration to form the gold concentration region 5 at the point $D_2$ and the point $E_2$, and therefore, even when the gold concentration region 5 is not formed locally in the curve AD and the curve BE, there is no adverse effect on the suppression effect on the ion migration.

A measuring method of the gold concentration of the gold concentration region 5 on the FAB 4 surface formed at one end of the gold-coated silver bonding wire 1 of the embodiment is concretely described. The FAB 4 (including a wire portion connecting with the ball) formed at the wire 1 is placed in a cylindrical mold in a direction allowing a cross section of the ball 4 parallel to the longitudinal direction of the wire 1 to be polished, an embedding resin is poured thereinto, and a curing agent is added to cure the resin. Thereafter, the cured cylindrical resin is roughly polished by an abrader so that the vicinity of the center of the ball 4 is exposed as much as possible. After being polished almost up to the vicinity of the central cross section of the ball 4, a fine adjustment is made by an ion milling apparatus so that a surface being prepared for a final polished finish and including a ball central portion is just exposed to be in a position of an analysis surface. When a width of the cross section of the wire 1 has a length of the diameter of the wire 1, the cross section becomes a standard for the surface including the central portion of the ball 4.

In order to quantitatively measure the presence or absence of the formation of the gold concentration region 5, in the above-described analysis surface (polished cross section) of the FAB 4, from the outside of the ball 4 (embedding resin side) toward the center of the inside of the ball 4, the line analysis is performed by an energy dispersive X-ray spectrometry (EDX) attached to a field emission-scanning electron microscope (FE-SEM), thereby making it possible to confirm the gold concentration region 5. As line analysis conditions, by using FE-SEM SU8220 manufactured by Hitachi High-Technologies Corporation and XFlash®5060FQ manufactured by Bruker Corporation, an acceleration voltage is set to 6 keV, a measuring length is set to 2 µm, a measurement interval is set to 0.03 µm, and a measurement time is set to 60 seconds. In a concentration profile of the line analysis, as long as a section where the gold concentration is 8 mass % or more with respect to the total content of silver and gold is present from an interface between the FAB 4 and the embedding resin to a position up to 100 nm inside the FAB 4, it can be judged that the gold concentration region 5 is formed. Here, the interface between the FAB 4 and the embedding resin can be easily judged by a difference in contrast in a FE-SEM image of the ball cross section, and it can be confirmed by comparing the image and a graph of the line analysis whether the gold concentration region is formed in the required section.

Next, a manufacturing method of the gold-coated silver bonding wire of the embodiment will be explained. Note that the manufacturing method of the gold-coated silver bonding wire of the embodiment is not limited particularly to the below-indicated manufacturing method. The gold-coated silver bonding wire 1 of the embodiment can be obtained by producing a wire raw material by forming a gold layer containing gold as a main component and containing at least one sulfur group element selected from sulfur, selenium, and tellurium, on a silver wire material surface having silver composing the core material 2 as a main component, and by performing wire drawing to a wire diameter required for the gold-coated silver bonding wire 1 and performing heat treatment or the like as necessary, for example. The wire drawing for obtaining the gold-coated silver bonding wire 1 may be performed on the wire raw material, or may be performed on the silver wire material.

By melting silver having a predetermined purity when silver is used as the core material 2, or melting silver having a predetermined purity with additive elements when a silver alloy is used, a silver core material or a silver alloy core material can be obtained. For the melting, there is used a heating furnace such as an arc heating furnace, a high-frequency heating furnace, a resistance heating furnace, or a continuous casting furnace. For the purpose of preventing mixing of oxygen or hydrogen from the atmosphere, an upper portion of silver molten metal in the heating furnace is preferably held in a vacuum or an inert gas atmosphere such as argon or nitrogen. The molten core material is subjected to casting solidification from the heating furnace so as to have a predetermined wire diameter, or the molten core material is cast in a mold to form an ingot, and the ingot is rolled by rolls, and thereafter the silver wire material (including a pure silver wire material and a silver alloy wire material) can be obtained by drawing to the predetermined wire diameter.

As a method of forming the gold layer on the surface of the silver wire material, for example, a plating method (wet method) or a vapor deposition method (dry method) is used. Either an electrolytic plating method or an electroless plating method may be employed as the plating method. In the electrolytic plating such as strike plating or flash plating, a plating rate is fast, and application to gold plating is preferable due to good adhesiveness of the gold layer to the silver wire material. In order to contain the sulfur group element in the gold layer by the plating method, for example, in the above-described electrolytic plating, a plating solution containing a plating additive containing at least one selected from sulfur, selenium, and tellurium in a gold plating solution is used. At this time, adjusting the kind or amount of the plating additive makes it possible to adjust the sulfur group element content in the coating layer 3 and further to adjust the sulfur group element content in the wire 1.

As the vapor deposition method, it is possible to utilize physical vapor deposition (PVD) such as a sputtering method, an ion plating method, or a vacuum deposition method, or chemical vapor deposition (CVD) such as thermal CVD, plasma CVD, or a metal organic chemical vapor deposition method (MOCVD). According to these methods, washing of a gold-coating layer after formation is unnecessary, and there is no concern for surface contamination at a time of washing, or the like. As a method of containing the sulfur group element in the gold layer by the vapor deposition method, there is a method of using a gold target containing the sulfur group element to form the gold layer by magnetron sputtering or the like. Also in cases of applying other methods, it is sufficient to use a material containing the sulfur group element in a gold material.

Thus, the silver wire material coated with the gold layer containing the sulfur group element is drawn to a final wire diameter, and heat-treated as necessary, thereby manufacturing the gold-coated silver bonding wire 1 provided with the coating layer 3 on the surface of the silver core material 2. The wire drawing may be performed in a stage of the silver wire material, or the wire drawing may be performed on the silver wire material to the wire diameter having a certain degree of size to perform the wire drawing to the final wire diameter after forming the gold layer. The wire drawing and the heat treatment may be performed in stages.

A working ratio of the wire drawing is determined according to the final wire diameter, uses, or the like of the gold-coated silver bonding wire 1 to be manufactured. In general, the working ratio of the wire drawing is preferably 90% or more as a working ratio to which the silver wire material is drawn to the final wire diameter. This working ratio can be calculated as a reduction ratio of a wire cross-sectional area. The wire drawing is preferably performed so as to reduce the wire diameter in stages by using a plurality of diamond dies. In this case, a reduction of area (working ratio) per one diamond die is preferably not less than 5% nor more than 15%.

After drawing the silver wire material coated with the gold layer to the final wire diameter, final heat treatment is preferably performed. The final heat treatment is carried out in consideration of strain relief heat treatment for relieving strain of a metal structure remaining inside the wire 1 or required wire properties in the final wire diameter. A temperature and a time of the strain relief heat treatment are preferably determined in consideration of the required wire properties. Besides, heat treatment according to purposes may be performed in any stage of the wire manufacturing. As such heat treatment, there is cited the strain relief heat treatment in a drawing process of the wire, diffusion heat treatment for increasing bonding strength after forming the gold layer, or the like. Performing the diffusion heat treatment makes it possible to improve the bonding strength between the core material 2 and the coating layer 3. In the heat treatment, running heat treatment in which the wire is passed in a heating atmosphere heated to a predetermined temperature to perform the heat treatment is preferable because heating treatment conditions are easy to adjust. In a case of the running heat treatment, a heat treatment time can be calculated by a passing rate of the wire and a passing distance of the wire in a heating container. An electric furnace or the like is used as the heating container.

(Semiconductor Device and Manufacturing Method Thereof)

Figure 8:
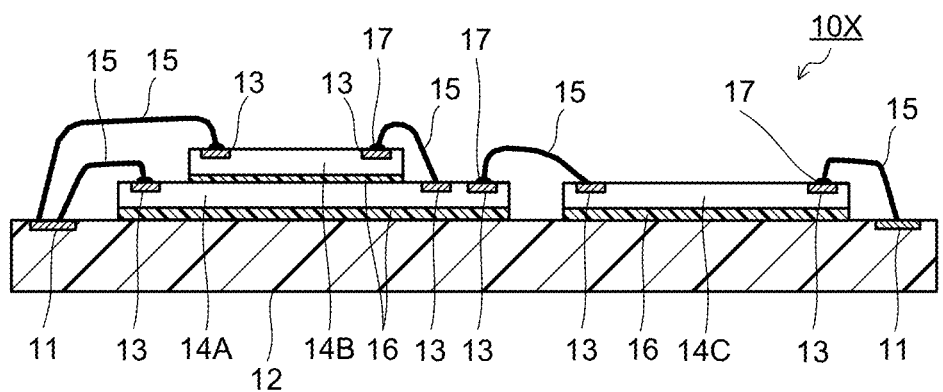
FIG. 8 is a cross-sectional view illustrating a stage before resin sealing of a semiconductor device of the embodiment.
Figure 10:
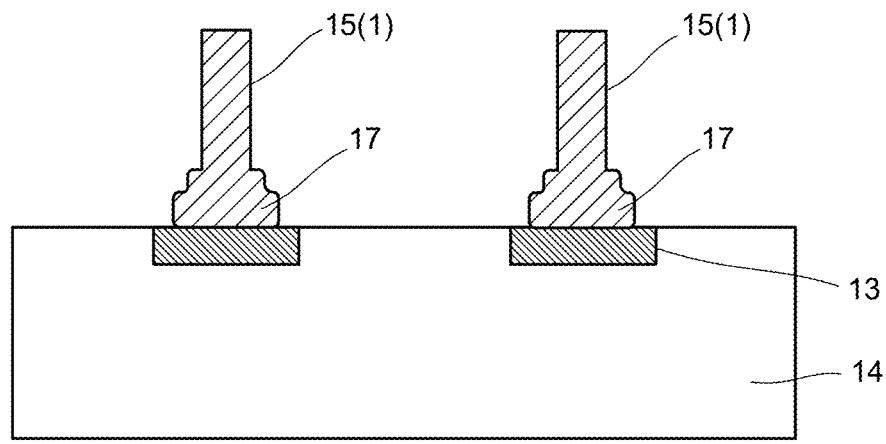
FIG. 10 is a cross-sectional view illustrating ball compression portions bonded to electrodes of a semiconductor chip in the semiconductor device of the embodiment.
Figure 11:
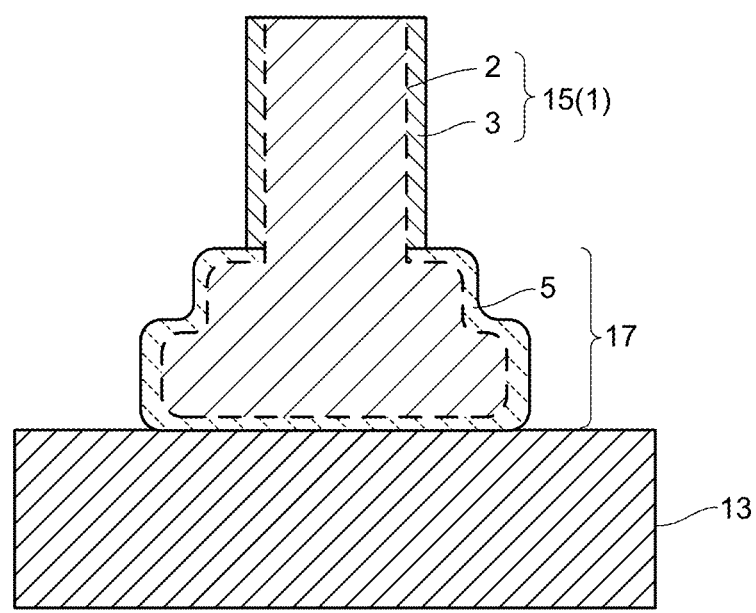
FIG. 11 is a cross-sectional view enlarging and illustrating the ball compression portion illustrated in FIG. 10.

Next, a semiconductor device using the gold-coated silver bonding wire 1 of the embodiment will be explained with reference to FIG. 8 to FIG. 11. FIG. 8 is a cross-sectional view illustrating a stage before resin sealing of the semiconductor device of the embodiment, FIG. 9 is a cross-sectional view illustrating a stage in which the resin sealing of the semiconductor device of the embodiment has been performed, FIG. 10 is a cross-sectional view illustrating ball compression portions bonded to electrodes of a semiconductor chip in the semiconductor device of the embodiment, and FIG. 11 is a cross-sectional view enlarging and illustrating the ball compression portion illustrated in FIG. 10.

Figure 9:
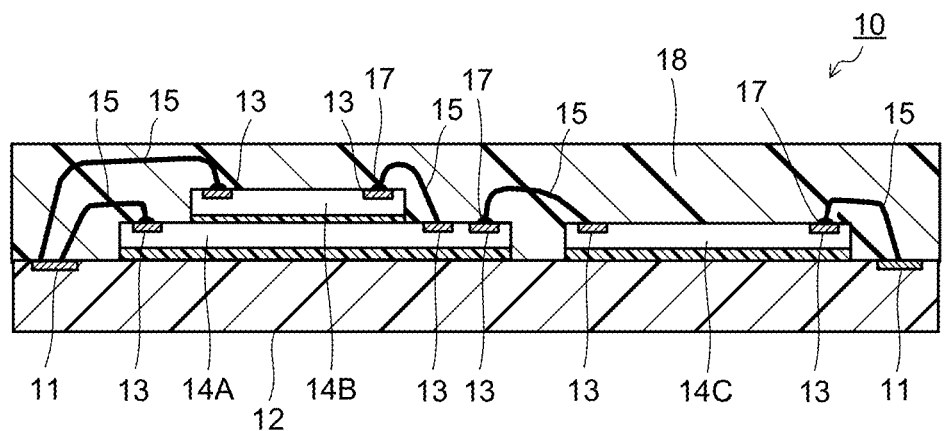
FIG. 9 is a cross-sectional view illustrating a stage in which the resin sealing of the semiconductor device of the embodiment has been performed.

As illustrated in FIG. 8 and FIG. 9, a semiconductor device 10 (semiconductor device 10X before resin sealing) of the embodiment includes a circuit board 12 having external electrodes 11, a plurality of semiconductor chips 14 (14A, 14B, and 14C) disposed on the circuit board 12 and each having at least one electrode (tip electrode) 13, and bonding wires 15 (gold-coated silver bonding wires 1) connecting the external electrodes 11 of the circuit board 12 and the electrodes 13 of the semiconductor chips 14, and the electrodes 13 of the plurality of semiconductor chips 14. For the circuit board 12, for example, there is used a printed wiring board, a ceramic circuit board, or the like provided with a wiring network on a surface or in the inside of an insulating substrate such as a resin material or a ceramic material.

Note that FIG. 8 and FIG. 9 each illustrate the semiconductor device 10 mounting the plurality of semiconductor chips 14 on the circuit board 12, but a configuration of the semiconductor device 10 is not limited to this. For example, the semiconductor chip may be mounted on a lead frame, and in that case, the electrode of the semiconductor chip is connected via the bonding wire 15 to an outer lead functioning as an external electrode of the lead frame. The number of semiconductor chips to be mounted with respect to the circuit board or the lead frame may be either one semiconductor chip or a plurality of semiconductor chips. The bonding wire 15 is applied at least one of between the external electrode 11 of the circuit board 12 and the electrode 13 of the semiconductor chip 14, between the lead frame and the electrode of the semiconductor chip, and between the electrodes 13 of the plurality of semiconductor chips 14.

Among the plurality of semiconductor chips 14 of the semiconductor device 10 illustrated in FIG. 8 and FIG. 9, the semiconductor chips 14A and 14C are each mounted via a die-bonding material 16 on a chip mounting area on the circuit board 12. The semiconductor chip 14B is mounted via the die-bonding material 16 on the semiconductor chip 14A. One electrode 13 of the semiconductor chip 14A is connected via the bonding wire 15 to the external electrode 11 of the circuit board 12, another electrode 13 is connected via the bonding wire 15 to the electrode 13 of the semiconductor chip 14B, and furthermore the other electrode 13 is connected via the bonding wire 15 to the electrode 13 of the semiconductor chip 14C. The other electrode 13 of the semiconductor chip 14B is connected via the bonding wire 15 to the external electrode 11 of the circuit board 12. The other electrode 13 of the semiconductor chip 14C is connected via the bonding wire 15 to the external electrode 11 of the circuit board 12.

The semiconductor chip 14 includes an integrated circuit (IC) formed of silicon (Si) semiconductors, compound semiconductors, or the like. The tip electrode 13 is formed of an aluminum electrode having an aluminum (Al) layer or an aluminum alloy layer such as AlSiCu or AlCu at least on the uppermost surface, for example. The aluminum electrode is formed by covering an electrode material such as Al or an Al alloy so as to be electrically connected to internal wiring on a surface of a silicon (Si) substrate, for example. The semiconductor chip 14 performs data communication with an external device or is supplied with electric power from the external device via the external electrode 11 and the bonding wire 15.

The external electrode 11 of the circuit board 12 is electrically connected via the bonding wire 15 to the electrode 13 of the semiconductor chip 14 mounted on the circuit board 12. In the semiconductor device 10 of the embodiment, the bonding wires 15 are each constituted of the above-described gold-coated silver bonding wire 1 of the embodiment. In the bonding wire 15, one end thereof is ball-bonded (first bonding) to the tip electrode 13, and the other end thereof is wedge-bonded (second bonding) to the external electrode 11 (positive bonding). Note that the formation order of the ball bonding (first bonding) and the wedge bonding (second bonding) may be reversed. That is, one end of the bonding wire 15 may be ball-bonded (first bonding) to the external electrode 11, and the other end thereof may be wedge-bonded (second bonding) to the tip electrode 13 (reverse bonding). A case where the bonding wires 15 connect the electrodes 13 of the plurality of semiconductor chips 14 is also similar to the above case. Note that the electrode 13 of the semiconductor chip 14 electrically bonded by the bonding wire 15 also includes a bump (not illustrated) previously bonded to the electrode on the semiconductor chip 14.

For example, when one end of the bonding wire 15 is ball-bonded to the tip electrode 13, by melting one end of the bonding wire 15 by discharge or the like and spherically solidifying one end thereof based on the surface tension or the like, the FAB 4 as illustrated in FIG. 3 is formed. As described above, in the formation process of the FAB 4, by the coating layer 3 on the wire 1 surface, the gold concentration region 5 is formed in the surface region of the FAB 4. Such a FAB 4 is subjected to bonding to the tip electrode 13 by an ultrasonic wave-combined thermocompression bonding method or the like, thereby forming ball compression portions 17 illustrated in FIG. 10 and FIG. 11 on the tip electrodes 13. After this, a sealing resin layer 18 is formed on the circuit board 12 so as to resin-seal the plurality of semiconductor chips 14 and the bonding wires 15, thereby manufacturing the semiconductor device 10. When the semiconductor device is concretely cited, there are a logic IC, an analog IC, a discrete semiconductor, a memory, an optical semiconductor, and the like.

Since the gold concentration region 5 illustrated in FIG. 3 is formed in the surface region of the FAB 4, the gold concentration region 5 is also formed on a surface of the ball compression portion 17 similarly to the FAB 4. Here, when the FAB 4 is bonded to the tip electrode 13 such as the aluminum electrode, a bonding portion in which a constituent element of the tip electrode 13, such as aluminum, and constituent elements of the FAB 4 having the gold concentration region 5 are mixed or alloyed is formed. The gold concentration region 5 of the ball compression portion 17 is present on a surface exposed from the tip electrode 13 in the portion not involved in formation of the bonding portion. The gold concentration region 5 of the ball compression portion 17 is formed at least on the surface of the ball compression portion 17, further for example, in a range of 10 μm or less from the surface in the depth direction of the ball compression portion 17 (or 10% or less with respect to the diameter of the FAB), and has the gold concentration of 8 mass % or more with respect to the total content of silver and gold, similarly to the FAB 4. This makes it possible to suppress the occurrence of the ion migration between the ball compression portions 17.

As described above, the ion migration is a phenomenon in which application of an electric field and water cause ionization of metal, and metal ions move between the ball compression portions to be thereafter precipitated, which causes an insulation deterioration or a short circuit, and silver is a metal likely to cause the ion migration. With respect to such a point, the region where gold less likely to cause the ion migration has been concentrated (gold concentration region) 5 is present in the surface region of the ball compression portion 17, which relatively reduces the silver concentration on the surface, so that it is possible to suppress the ion migration between the ball compression portions 17 each formed by using the gold-coated silver bonding wire 1. Accordingly, it becomes possible to provide the semiconductor device 10 which suppresses a reduction in reliability and soundness of the semiconductor device 10 due to insulation failure, a short circuit, or the like between the ball compression portions 17 and is excellent in insulation reliability or the like. Moreover, as illustrated in FIG. 10, even when a formation pitch P of the tip electrodes 13 has a narrower pitch so as to be 100 μm or less, it is possible to effectively suppress the insulation failure, the short circuit, or the like between the ball compression portions 17.

Note that the gold concentration region 5 of the ball compression portion 17 basically has a constitution similar to that of the gold concentration region 15 of the FAB 4, and a concrete constitution is as described above. Further, it is preferable that specification and measurement of the gold concentration region 5 of the ball compression portion 17 are performed similarly to the above-described gold concentration region 5 of the FAB 4, and each have similar conditions.

EXAMPLES

Next, examples of the present invention will be explained. The present invention is not limited to the following examples. Examples 1 to 44 are the examples, and Examples 45 to 60 are comparative examples.

Examples 1 to 44

As a core material, a silver core material having a purity of 99% produced by continuous casting was prepared, and subjected to continuous wire drawing to be drawn to an intermediate wire diameter of 0.05 mm to 1.0 mm. Moreover, a gold-coating layer was formed on a silver wire material having the intermediate wire diameter as follows. In a gold electroplating bath in which each additive of sulfur, selenium, and tellurium was added in a proper content, in a state of immersing the silver wire material while they were continuously sent, a current was made to flow through the silver wire material at a current density of not less than 0.20 A/dm$^2$ nor more than 1.0 A/dm$^2$, to form the gold-coating layer containing the sulfur group element. After this, final heat treatment was performed on a wire subjected to wire drawing to φ20 μm of a final wire diameter, to produce gold-coated silver bonding wires from Example 1 to Example 36. These gold-coated silver bonding wires were provided for the later-described property evaluation.

Comparative Examples 45 to 50

Gold-coated silver bonding wires were produced similarly to the examples except that the additive of the sulfur group element was not added in the Au plating bath. These gold-coated silver bonding wires were provided for the later-described property evaluation.

Comparative Examples 51 to 60

Gold-coated silver bonding wires were produced similarly to the examples except that Au plating baths in each of which the sulfur group element content in a coating layer was adjusted so as to be a value presented in Table 1 were used. These gold-coated silver bonding wires were provided for the later-described property evaluation.

(Content Measurement)

The gold content and the sulfur group element content in each of the gold-coated silver bonding wires were measured according to the above-described method. Table 1 presents the results.

(Wire Appearance Inspection)

By using a laser microscope (brand name: VK-X200) manufactured by KEYENCE CORPORATION with respect to an appearance of each of the gold-coated silver bonding wires each having the intermediate wire diameter and the final wire diameter, the presence or absence of a fracture (crack) of a gold coating film was confirmed at high magnification. A case where tensile stress generated mainly at a time of wire drawing causes the crack in the gold coating film and an exposure of the silver core material was seen in even one of ten wires was set as "B" (failed), and a case where the exposure was not seen in any wire was set as "A" (passed). Table 1 presents the result.

(Measurement of Gold Concentration Region)

Next, by using a commercially available wire bonding apparatus (manufactured by Kulicke & Soffa Industries, Inc., IConn PLUS) with respect to each of the produced gold-coated silver bonding wires, EFO conditions were set so that a diameter of a FAB became 36 µm, and the FAB was formed in the atmosphere. Thereafter, a line analysis was performed on the FAB in positions of points D (a point $D_1$, a point $D_2$, a point $D_3$) and points E (a point $E_1$, a point $E_2$, a point $E_3$) which were located at 50%, 60%, and 70% from a neck portion respectively, by using a FE-SEM/EDX. As results of the line analysis of the respective points, a gold concentration of less than 8 mass % with respect to a total of gold and silver was set as "B" (the absence of a gold concentration region), and the presence of 8 mass % or more was set as "A" (the presence of a gold concentration region). Note that as a result, since it was necessary for the solution to the ion migration that both the points, such as (the point $D_1$, the point $E_1$), (the point $D_2$, the point $E_2$), and (the point $D_3$, the point $E_3$), having the same formation range from the neck portion satisfy the condition, only a case where both the points each satisfy the condition was determined as "A" (the presence of a gold concentration region). For example, when both the point $D_2$ and the point $E_2$ were determined as A, an analysis position 60% of the gold concentration region was determined as "A", and when at least either of the point $D_2$ and the point $E_2$ was determined as B, an analysis position 60% of the gold concentration region was determined as "B". Table 1 presents the above results.

(Ion Migration Evaluation)

By using the commercially available wire bonding apparatus (manufactured by Kulicke & Soffa Industries, Inc., IConn PLUS) with respect to each of the produced gold-coated silver bonding wires, the EFO conditions were set so that a diameter of a FAB became 36 µm, and the FAB was formed in the atmosphere. Thereafter, by a ball bonding method based on an ultrasonic wave-combined thermocompression method with respect to an aluminum alloy pad on a Si chip for evaluation heated to 150° C., under a bonding condition in which an average diameter of a compression ball became 45 µm, the primary bonding was performed, and the secondary bonding was performed under a predetermined bonding condition by a stitch bonding method based on the ultrasonic wave-combined thermocompression method between a lead terminal of a BGA substrate Au-plated on Ni by using electrolytic plating and the wire, resulting in connecting a total of 32 wires per one chip. The connected wires constitute a total of 16 circuits based on the two wires connected between the tip electrode and the lead terminal and a pair of tip electrodes. By attaching these circuits to a dedicated jig capable of applying bias, from a voltage source such as a multimeter through a terminal of the jig from the lead terminal on the BGA substrate, a voltage was applied to ball compression portions of the finally connected circuits. This ball compression portion corresponds to either an anode or a cathode. That is, eight pairs of the anode and the cathode are formed per one chip. The insulation is performed between the anode and the cathode in the chip, and a distance between the ball compression portions being the anode and the cathode is 125 µm though slightly varied depending on positional accuracy of the bonding or a diameter of the compression ball.

Previous to the ion migration evaluation, the BGA substrate in a state of connecting the wires was subjected to bake treatment under conditions of 175° C. and three hours in a high temperature furnace. Subsequently, the BGA substrate subjected to the bake treatment was attached to a dedicated jig, and pure water was dropped on the tip electrode. Thereafter, by using a constant voltage source (manufactured by Hewlett-Packard Company, E3632A), a constant voltage of 2 V was applied to the eight pairs of the anode and the cathode so that an electric field intensity between the electrodes became 16 kV. A constant voltage application time was set to 60 seconds. In the presence or absence of occurrence of the ion migration, visual determination was performed by using a stereomicroscope after the application time passed. A case where metal precipitated in a dendritic form (dendrite) was confirmed between the anode and the cathode was determined as the presence of occurrence of the ion migration. A case where the ion migration occurred in one or more pairs among the eight pairs was determined as "B" (failed), and a case where no ion migration occurred was determined as "A" (passed). Table 1 presents the determination result.

TABLE 1

| | | Gold content [mass %] | Sulfur group element content [mass ppm] | | | | Wire AI *3 | Analysis position of gold region *4 | | | IM evaluation *5 |
|---|---|---|---|---|---|---|---|---|---|---|---|
| | | | S | Se | Te | Total (S + Se + Te) | | 50% | 60% | 70% | |
| Ex *1 | 1 | 4.5 | — | — | 1.8 | 1.8 | A | A | A | B | A |
| | 2 | 3.8 | — | — | 11.8 | 11.8 | A | A | A | A | A |

TABLE 1-continued

|  |  | Gold content [mass %] | Sulfur group element content [mass ppm] | | | | Wire AI *3 | Analysis position of gold region *4 | | | IM evaluation *5 |
|---|---|---|---|---|---|---|---|---|---|---|---|
|  |  |  | S | Se | Te | Total (S + Se + Te) |  | 50% | 60% | 70% |  |
|  | 3 | 2.1 | — | — | 6.1 | 6.1 | A | A | A | A | A |
|  | 4 | 6.0 | — | — | 28.8 | 28.8 | A | A | A | A | A |
|  | 5 | 5.2 | — | — | 19.8 | 19.8 | A | A | A | A | A |
|  | 6 | 4.4 | — | — | 18.0 | 18.0 | A | A | A | A | A |
|  | 7 | 4.8 | — | — | 31.2 | 31.2 | A | A | A | A | A |
|  | 8 | 4.0 | — | — | 40.0 | 40.0 | A | A | A | A | A |
|  | 9 | 3.5 | — | — | 75.3 | 75.3 | A | A | A | A | A |
|  | 10 | 3.3 | — | — | 7.3 | 7.3 | A | A | A | A | A |
|  | 11 | 4.6 | — | — | 4.8 | 4.8 | A | A | A | A | A |
|  | 12 | 2.7 | — | — | 67.5 | 67.5 | A | A | A | A | A |
|  | 13 | 6.2 | — | — | 78.7 | 78.7 | A | A | A | A | A |
|  | 14 | 2.4 | — | 3.1 | — | 3.1 | A | A | A | B | A |
|  | 15 | 6.8 | — | 48.3 | — | 48.3 | A | A | A | A | A |
|  | 16 | 4.2 | — | 1.2 | — | 1.2 | A | A | A | B | A |
|  | 17 | 3.6 | — | 39.6 | — | 39.6 | A | A | A | A | A |
|  | 18 | 5.5 | — | 16.5 | — | 16.5 | A | A | A | A | A |
|  | 19 | 3.7 | — | 12.6 | — | 12.6 | A | A | A | A | A |
|  | 20 | 4.5 | — | 56.7 | — | 56.7 | A | A | A | A | A |
|  | 21 | 5.0 | — | 21.0 | — | 21.0 | A | A | A | A | A |
|  | 22 | 2.5 | — | 60.8 | — | 60.8 | A | A | A | A | A |
|  | 23 | 4.0 | — | 76.4 | — | 76.4 | A | A | A | A | A |
|  | 24 | 2.8 | 2.2 | — | — | 2.2 | A | A | A | B | A |
|  | 25 | 6.6 | 26.4 | — | — | 26.4 | A | A | A | A | A |
|  | 26 | 5.8 | 3.8 | — | — | 3.8 | A | A | A | B | A |
|  | 27 | 5.3 | 33.4 | — | — | 33.4 | A | A | A | A | A |
|  | 28 | 3.0 | 51.3 | — | — | 51.3 | A | A | A | A | A |
|  | 29 | 4.5 | 8.6 | — | — | 8.6 | A | A | A | A | A |
|  | 30 | 4.0 | 10.8 | — | — | 10.8 | A | A | A | A | A |
|  | 31 | 2.5 | 62.5 | — | — | 62.5 | A | A | A | A | A |
|  | 32 | 3.5 | 5.3 | — | — | 5.3 | A | A | A | A | A |
|  | 33 | 4.3 | 2.8 | — | — | 2.8 | A | A | A | B | A |
|  | 34 | 4.2 | 3.1 | 8.2 | — | 11.3 | A | A | A | A | A |
|  | 35 | 5.3 | 7.6 | 7.2 | — | 14.8 | A | A | A | A | A |
|  | 36 | 2.9 | 2.0 | 2.4 | — | 4.4 | A | A | A | A | A |
|  | 37 | 6.4 | 9.0 | 33.2 | — | 42.2 | A | A | A | A | A |
|  | 38 | 4.1 | 1.6 | — | 20.1 | 21.7 | A | A | A | A | A |
|  | 39 | 5.5 | 4.6 | — | 6.4 | 11.0 | A | A | A | A | A |
|  | 40 | 5.0 | 3.9 | — | 11.6 | 15.5 | A | A | A | A | A |
|  | 41 | 3.6 | 1.1 | — | 12.2 | 13.3 | A | A | A | A | A |
|  | 42 | 3.0 | — | 8.2 | 11.3 | 19.5 | A | A | A | A | A |
|  | 43 | 6.2 | — | 20.7 | 25.2 | 45.9 | A | A | A | A | A |
|  | 44 | 4.7 | — | 17.2 | 14.8 | 32.0 | A | A | A | A | A |
| C-Ex *2 | 45 | 1.5 | — | — | — | 0.0 | A | B | B | B | B |
|  | 46 | 7.5 | — | — | — | 0.0 | A | B | B | B | B |
|  | 47 | 1.3 | — | — | — | 0.0 | A | B | B | B | B |
|  | 48 | 8.7 | — | — | — | 0.0 | A | B | B | B | B |
|  | 49 | 0.6 | — | — | — | 0.0 | A | B | B | B | B |
|  | 50 | 10.2 | — | — | — | 0.0 | A | B | B | B | B |
|  | 51 | 4.8 | — | 0.5 | — | 0.5 | A | A | B | B | B |
|  | 52 | 3.7 | — | 88.8 | — | 88.8 | B | — | — | — | — |
|  | 53 | 2.5 | — | 0.2 | — | 0.2 | A | A | B | B | B |
|  | 54 | 6.8 | — | 102.0 | — | 102.0 | B | — | — | — | — |
|  | 55 | 4.1 | — | — | 0.2 | 0.2 | A | A | B | B | B |
|  | 56 | 3.0 | — | — | 0.7 | 0.7 | A | A | B | B | B |
|  | 57 | 5.1 | — | — | 91.8 | 91.8 | B | — | — | — | — |
|  | 58 | 3.2 | 0.3 | — | 0.2 | 0.5 | A | A | B | B | B |
|  | 59 | 6.0 | 0.4 | — | 0.4 | 0.8 | A | A | B | B | B |
|  | 60 | 5.4 | — | 55.7 | 63.1 | 118.8 | B | — | — | — | — |

*1: Examples
*2: Comparative Examples
*3: Wire appearance inspection (AI)
*4: Analysis position of gold concentration region
*5: Ion migration (IM) evaluation As presented in Table 1, according to each of the gold-coated silver bonding wires in Examples 1 to 36, it is possible to form the FAB having the gold concentration region in an appropriate region of the surface. Moreover, when such a FAB is ball-bonded to the electrode of the semiconductor chip to manufacture the semiconductor device, the insulation failure, the short circuit, or the like between the ball compression portions can be suppressed. Accordingly, it becomes possible to inexpensively provide sound wire-bonding structure and semiconductor device excellent in insulation reliability and the like. In contrast to this, as presented in the results in each of Comparative examples 45 to 50 in Table 1, it is found that no addition of the sulfur group element to the coating layer causes the gold concentration region not to be formed. Further, as presented in the results in each of Comparative examples 52, 54, 57, and 60 in Table 1, a too large content (the content over 80 ppm with respect to a total content of the wire) of the sulfur group element in the coating layer causes a crack, a fracture, or the like in the gold-coating layer. Moreover, as presented in the results in each of Comparative examples 51, 53, 55, 56, 58, and 59 in Table 1, a too small content (the content less than 1 ppm with respect to the total content of the wire) of the sulfur group element in the coating layer causes the gold concentration region to be formed on a part of a surface of the FAB, but it is not possible to form the gold concentration region necessary for suppression of the ion migration. Accordingly, each of the gold-coated silver bonding wires in Comparative examples cannot suppress the insulation failure, the short circuit, or the like between the ball compression portions each using the FAB formed at one end thereof

What is claimed is:

1. A gold-coated silver bonding wire comprising:
a core material containing silver as a main component; and
a coating layer provided on a surface of the core material and containing gold as a main component,
wherein the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the bonding wire.

2. A gold-coated silver bonding wire comprising:
a core material containing silver as a main component; and
a coating layer provided on a surface of the core material and containing gold as a main component,
wherein the gold-coated silver bonding wire contains gold in a range of not less than 2 mass % nor more than 7 mass % with respect to a total content of the bonding wire, and at least one sulfur group element selected from the group consisting of sulfur, selenium, and tellurium in a range of not less than 1 mass ppm nor more than 80 mass ppm with respect to a total content of the bonding wire, and
wherein, when a free air ball is formed at one end of the gold-coated silver bonding wire, the free air ball has, in a cross-sectional view of the bonding wire and the free air ball, on a vertical line stretching from a midpoint of a line connecting neck portions between the wire and the ball to a position corresponding to a lowest point of the ball, a gold concentration region in a section corresponding to a position of 60% or more from the midpoint of the line connecting the neck portions.

3. The bonding wire according to claim 2,
wherein a gold concentration in the gold concentration region is 8 mass % or more with respect to a total content of the silver and the gold.

4. A manufacturing method of the gold-coated silver bonding wire comprising a core material containing silver as a main component, and a coating layer provided on a surface of the core material and containing gold as a main component,
wherein the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the bonding wire.

5. A semiconductor device comprising:
one semiconductor chip having at least one electrode or a plurality of semiconductor chips each having at least one electrode; and
a lead frame or a board having at least one electrode,
wherein a gold-coated silver bonding wire is connected at least one selected from between the electrode of the semiconductor chip and the lead frame, between the electrode of the semiconductor chip and the electrode of the board, and between the electrodes of the plurality of semiconductor chips, and
wherein the gold-coated silver bonding wire comprises:
a core material containing silver as a main component; and
a coating layer provided on a surface of the core material and containing gold as a main component, wherein
the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the bonding wire.

6. A manufacturing method of the semiconductor device comprising one semiconductor chip having at least one electrode or a plurality of semiconductor chips each having at least one electrode, and a lead frame or a board having at least one electrode,
wherein a gold-coated silver bonding wire is connected at least one selected from between the electrode of the semiconductor chip and the lead frame, between the electrode of the semiconductor chip and the electrode of the board, and between the electrodes of the plurality of semiconductor chips, and
wherein the gold-coated silver bonding wire comprises:
a core material containing silver as a main component; and
a coating layer provided on a surface of the core material and containing gold as a main component, wherein
the gold-coated silver bonding wire contains gold in a range of not less than 2 mass % nor more than 7 mass %, and at least one sulfur group element selected from the group consisting of sulfur, selenium, and tellurium in a range of not less than 1 mass ppm nor more than 80 mass ppm, with respect to a total content of the bonding wire.

* * * * *